(12) United States Patent
Hong

(10) Patent No.: US 7,679,970 B2
(45) Date of Patent: Mar. 16, 2010

(54) SEMICONDUCTOR MEMORY DEVICE FOR SIMULTANEOUSLY PERFORMING READ ACCESS AND WRITE ACCESS

(75) Inventor: Sang Hoon Hong, Gyeonggi-do (KR)

(73) Assignee: University-Industry Cooperation Group of Kyung Hee University, Gyeonggi-Do (KR)

( * ) Notice: Subject to any disclaimer, the term of this patent is extended or adjusted under 35 U.S.C. 154(b) by 157 days.

(21) Appl. No.: 12/059,080

(22) Filed: Mar. 31, 2008

(65) Prior Publication Data

US 2008/0259692 A1   Oct. 23, 2008

(30) Foreign Application Priority Data

Apr. 23, 2007   (KR) ...................... 10-2007-0039578

(51) Int. Cl.
*G11C 7/10* (2006.01)

(52) U.S. Cl. ..................... 365/189.04; 365/205; 365/63

(58) Field of Classification Search ............ 365/189.04, 365/205, 63
See application file for complete search history.

(56) References Cited

U.S. PATENT DOCUMENTS

| 6,950,337 | B2 * | 9/2005 | Bellini et al. | .......... 365/189.04 |
| 7,180,814 | B2 * | 2/2007 | Luk et al. | .............. 365/189.04 |

* cited by examiner

*Primary Examiner*—Huan Hoang
(74) *Attorney, Agent, or Firm*—Occhiuti Rohlicek & Tsao LLP

(57) ABSTRACT

Disclosed herein is a semiconductor memory device which can simultaneously perform a read access and a write access independently. The semiconductor memory device according to the present invention can access a plurality of data through the global sense amplifying unit and the global bit line, and enables the read controller and the write controller to independently control the global bit line and the bit line sense amplifying unit to be connected to each other to thereby perform the read access and the write access simultaneously.

5 Claims, 5 Drawing Sheets

SEMICONDUCTOR MEMORY DEVICE FOR SIMULTANEOUSLY PERFORMING READ ACCESS AND WRITE ACCESS

CROSS-REFERENCE TO RELATED APPLICATION

This application claims the benefit under 35 U.S.C. §119 (a) of Korean Patent Application No. 10-2007-0039578 filed on Apr. 23, 2007, the entire contents of which are incorporated herein by reference.

BACKGROUND OF THE INVENTION

1. Field of the Invention

The present invention relates to a semiconductor memory device, and more particularly to a semiconductor memory device which can simultaneously perform a read access and a write access independently.

2. Background of the Related Art

A semiconductor memory device can be largely classified into a random access memory (RAM) and a read only memory (ROM). The RAM is divided into a dynamic RAM in which one transistor and one capacitor constitute one unit cell and a static RAM which six transistors or four transistors and two load resistors constitute one unit cell. The dynamic RAM efficient in integration and fabrication is widely used in various fields including a main memory of a computer, etc.

FIG. 1 is a schematic block diagram showing the construction of a semiconductor memory device according to a prior art.

Referring to FIG. 1, the semiconductor memory device includes a bank 100 having a row address decoder and a column address decoder, a command controller 200 and a data input/output buffer 300. The command controller 200 receives a plurality of command signals RAS, CAS, WE, CS, CKE, CK, etc., from the outside so as to control the operations performed in the bank 100, such as, for example, read, write, refresh, etc. The bank 100 reads and outputs data of a unit cell corresponding to an address input thereto, or writes the data being input in the unit cell. Also, the data input/output buffer 300 buffers the data which is inputted/outputted to/from the bank 100 and inputs/outputs the buffered data from/to the outside.

A typical semiconductor memory device includes a plurality of banks, for example four banks. Since the respective banks have the same structure, only one bank 100 is shown in FIG. 1 for the sake of simplicity.

In addition, in FIG. 1, there are shown a minimum number of blocks necessary for explanation of the present invention among a plurality of blocks included in the semiconductor memory device.

A bank 100 includes eight segments 120a to 120h each having a plurality cell blocks and input/output sense amplifying units 110 and 130 for amplifying data outputted from the segments 120a to 120h for application to the data input/output buffer 300 or applying data inputted thereto from the data input/output buffer 300 to the segments 120a to 120h.

A segment (for example, reference numeral 120a) includes a row address decoder 121 for decoding a row address to output the decoded row address, a column address decoder 122 for decoding a column address to output the decoded column address, and a cell region 120a_1 composed of a plurality of unit cells, and adapted to receive the decoded row address from the row address decoder 121 and the decoded column address from the column address decoder 122. The cell region 120a_1 includes a plurality of cell blocks 124a to 124h each having a plurality of unit cells and a plurality of bit line sense amplifying units 123a to 123i alternately arranged between the cell blocks 124a to 124h so as to sense and amplify data outputted from the cell blocks.

The semiconductor memory device shown in FIG. 1 exemplifies a memory having a capacity of 256 Mb. In case where the semiconductor memory device consists of four banks, each bank has a capacity of 64 Mb. Each bank can consist of, for example, a total of eight segments, each of which has a capacity of 8 Mb. A segment (for example, reference numeral 120a) includes a total of eight cell blocks 124a to 124h. A cell block (for example, reference numeral 124a) includes 256 word lines WL and 4 K (4*1024) bit lines BL. In addition, each cell block includes 256*4 K unit cells. It is assumed that a segment has a capacity of 8 Mb and each of the eight cell blocks includes 256 word lines as described above.

FIG. 2 is a circuit diagram showing one example of a bit line sense amplifying unit and a cell block shown in FIG. 1.

Particularly, FIG. 2 partially shows a first cell block 124a and a second cell block 124b, and a bit line sense amplifying unit 123b.

Referring to FIG. 2, the first cell block 124a includes 256*4 K unit cells each consisting of a MOS transistor and a capacitor. Each of the word lines WL is connected to a gate terminal of each MOS transistor constituting each unit cell, and each of the bit lines BL is connected to a drain terminal of the MOS transistor constituting each unit cell while intersecting each of the bit lines BL and /BL. Each MOS transistor constituting a unit cell is connected at a source terminal thereof to one side of each capacitor constituting each unit cell, and the other side of each capacitor is connected to a cell plate power source (for example, ground power source). Although not shown, the second cell block 124b also has the same construction as that of the first cell block 124a.

The bit line sense amplifying unit 123b includes a bit line sense amplifier 123b_4, a precharger 123b_3, an equalizer 123b_2, a data output part 123b_5 and connection parts 123b_1 and 123b_6. The bit line sense amplifier 123b_4 is enabled in response to bit line sense amplifier enable signals RTO and /S to thereby to amplify a difference between signals applied to the bit lines (for example, BL0 and /BL0). The precharger 123b_3 is enabled in response to a precharge enable signal BLEQ' outputted when the bit line sense amplifier 123b_4 is disabled to thereby to precharge the bit lines (for example, BL0 and /BL0) with a bit line precharge voltage Vblp. The equalizer 123b_2 is enabled in response to an equalization signal BLEQ to thereby allow the voltage levels of a pair of bit lines (for example, BL0 and /BL0) connected to the first cell block 124a to be equal to each other. The data output part 123b_5 serves to output a data signal amplified by the bit line sense amplifier 123b_4 in response to a column control signal (for example, CDO) generated by a column address, to data lines DB0 and /DB0. Also, the connection parts 123b_1 and 123b_6 serves to selectively connect the bit line sense amplifier 123b_4 to the cell blocks 124a and 124b adjacent to the bit line sense amplifying unit 123b.

In this case, the number of bit line sense amplifiers included in the bit line sense amplifying unit 123b is determined depending on the number of bit line pairs included in adjacent cell blocks, and the bit line sense amplifying unit 123b is connected to the first cell block 124a or the second cell block 124b in response to sense amplifier connecting signals BISH and BISL. Although not shown in FIG. 2, the bit line pairs BL1 and /BL1 in 124a are connected to a bit line sense amplifier included in the bit line sense amplifying unit 123a and BL1 and /BL1 in 124b are connected to a bit line sense amplifier included in the bit line sense amplifying unit 124b.

In order to read data from the cell blocks in the conventional semiconductor memory device shown in FIGS. 1 and 2, it is required that the word lines should be first enabled and data of the cell block connected to the enabled word lines should be then outputted to the data line. In the meantime, in order to write data in a cell block, it is required that the word lines are enabled and data provided through the data line should be then written in the cell block connected to the enabled word lines. However, the semiconductor memory device according to such a conventional prior art entails a problem in that since data is written or read in or from the cell block through the data line according to the access mode, a write access and a read access cannot be simultaneously performed independently.

SUMMARY OF THE INVENTION

Accordingly, the present invention has been made in view of the aforementioned problems occurring in the prior art, and it is an object of the present invention to provide a semiconductor memory device which can simultaneously perform a write access and a read access so as to write and read data in and from the same unit cell block or different unit cell blocks.

Another object of the present invention is to provide a semiconductor memory device which can control a write access and a read access independently in the same unit cell block or different unit cell blocks.

To accomplish the above object, according to the present invention, there is provided a semiconductor memory device including a unit cell block having a plurality of unit cells and a bit line sense amplifying unit for sensing and amplifying data accessed to the unit cell block, the semiconductor memory device comprising: a first global sense amplifying unit for sensing and amplifying a plurality of data for write access to the unit cell block and latching the sensed and amplified data; a second global sense amplifying unit for latching a plurality of data read-accessed in the unit cell block; a first global bit line for transmitting data between the first global sense amplifying unit and the bit line sense amplifying unit; a second global bit line for transmitting data between the second global sense amplifying unit and the bit line sense amplifying unit; a control unit for independently controlling a first connection between the bit line sense amplifying unit and the first global bit line and a second connection between the bit line sense amplifying unit and the second global bit line according to an access mode.

BRIEF DESCRIPTION OF THE DRAWINGS

The above and other objects, features and advantages of the present invention will be apparent from the following detailed description of the preferred embodiments of the invention in conjunction with the accompanying drawings, in which.

DETAILED DESCRIPTION OF THE PREFERRED EMBODIMENT

Reference will now be made in detail to the preferred embodiment of the present invention with reference to the attached drawings.

Figure 1:
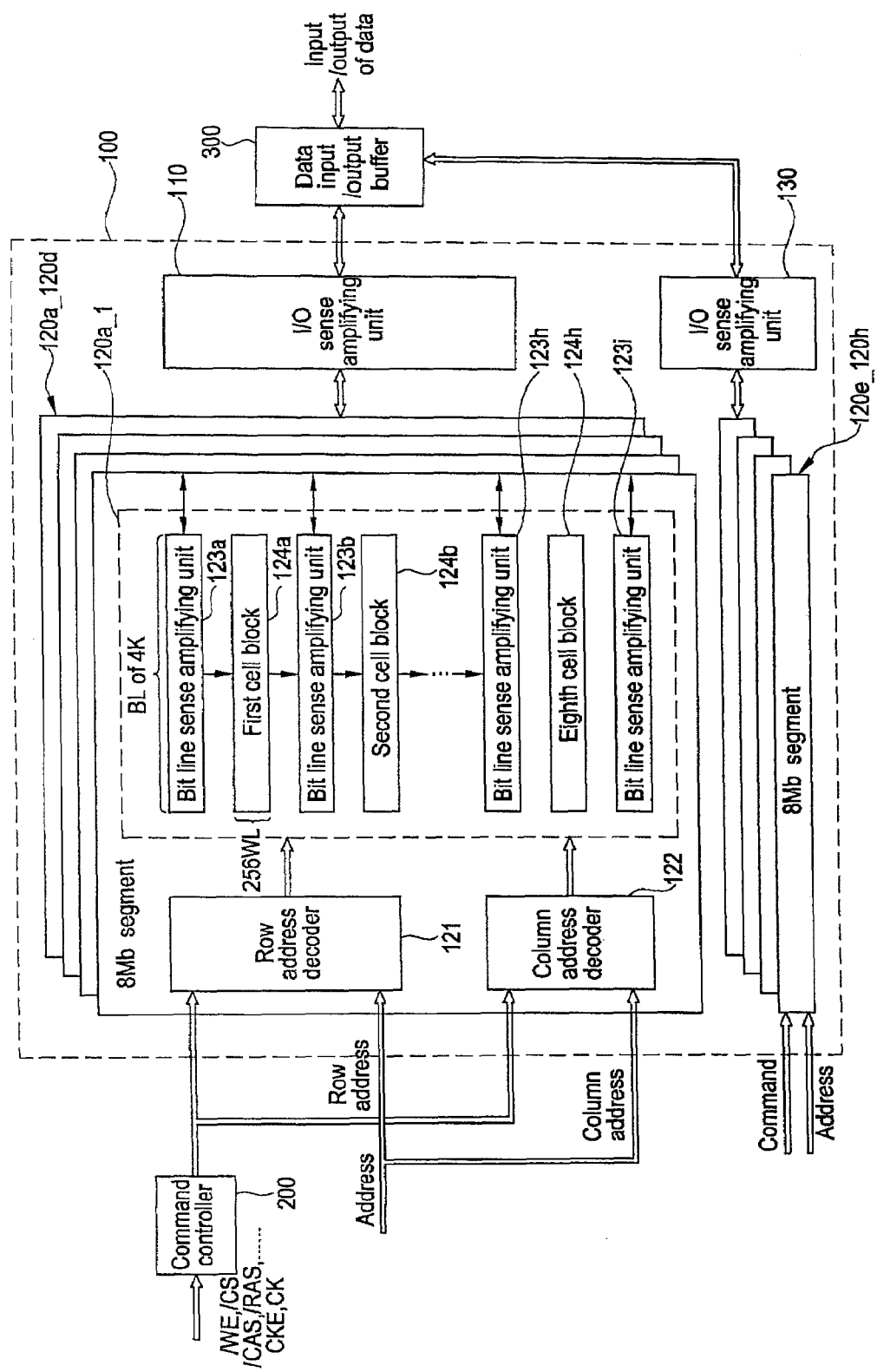
FIG. 1 is a schematic block diagram showing the construction of a semiconductor memory device according to a prior art.
Figure 2:
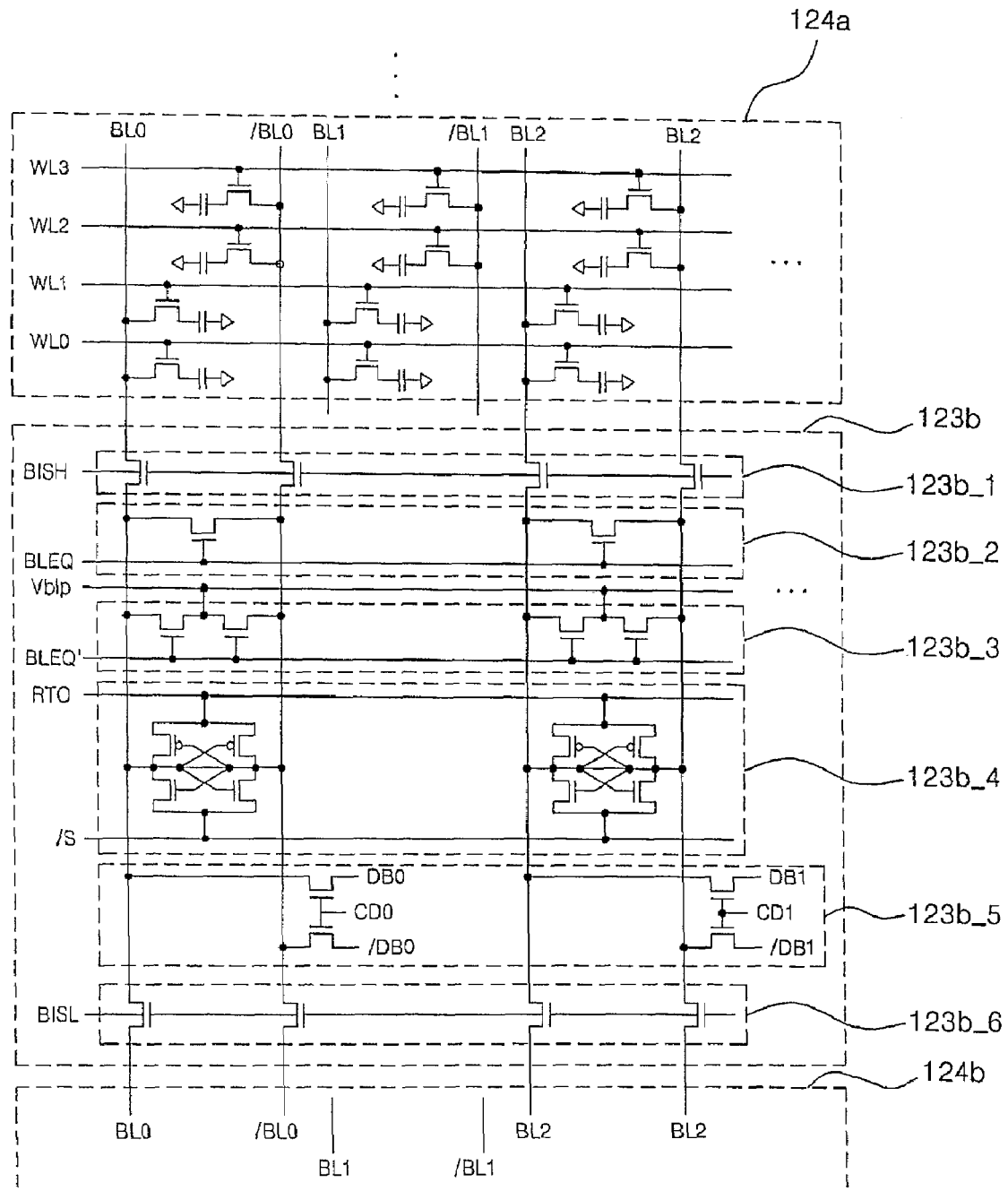
FIG. 2 is a circuit diagram showing one example of a bit line sense amplifying unit and a cell block shown in FIG. 1.
Figure 3:
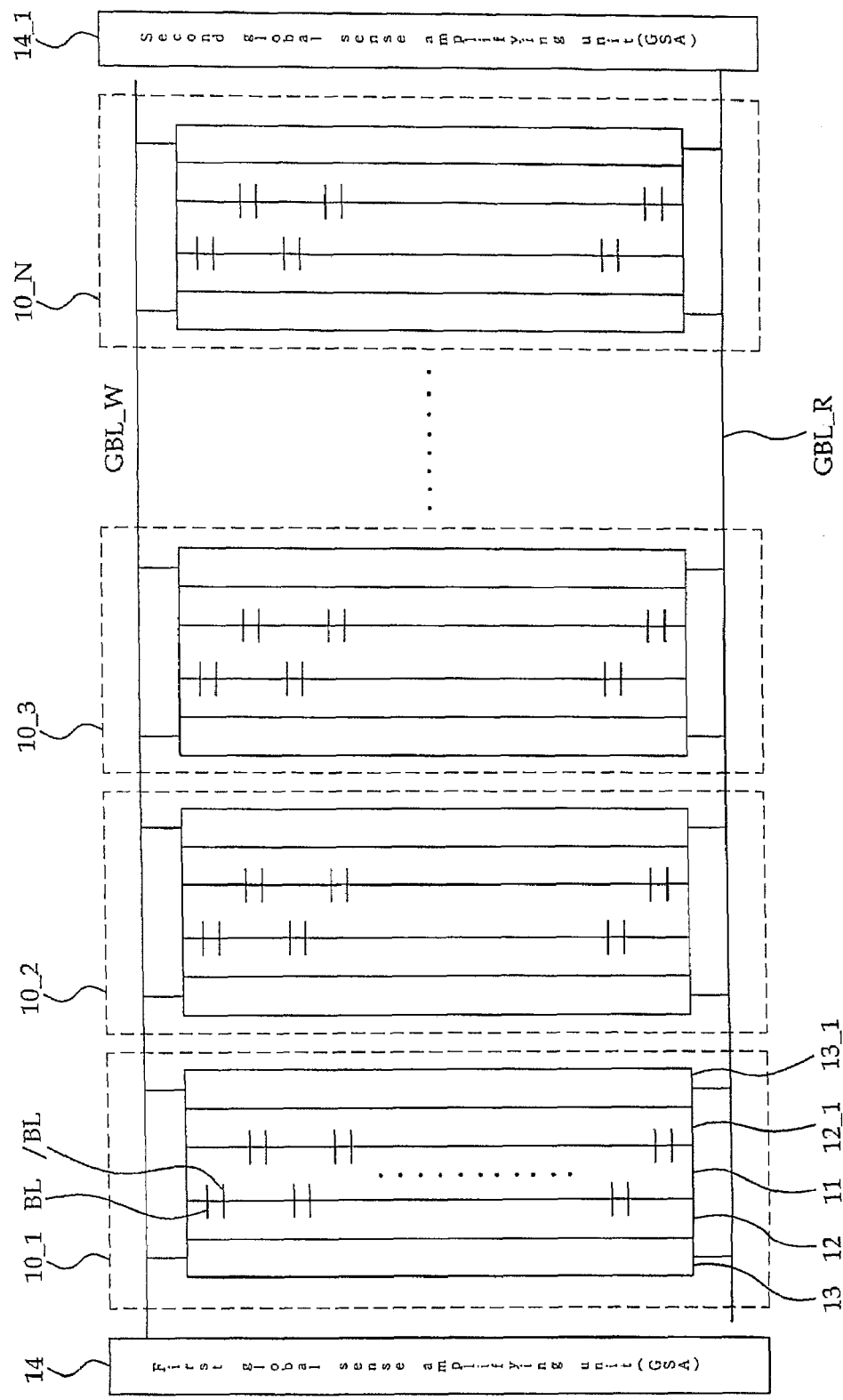
FIG. 3 is a schematic block diagram showing the construction of a semiconductor memory device according to an embodiment of present invention.

FIG. 3 is a schematic block diagram showing the construction of a semiconductor memory device according to an embodiment of present invention.

Referring to FIG. 3, the semiconductor memory device according to present invention includes a plurality of basic cell blocks 10_1, 10_2, . . . , 10_N having the same construction, global sense amplifying units 14 and 14_1 for latching a plurality of data accessed to respective unit cells of each basic cell block 10_1, 10_2, . . . , 10_N, and global bit lines GBL_W and GBL_R for transmitting data between the global sense amplifying units 14 and 14_1 and the plurality of basic cell blocks 10_1, 10_2, . . . , 10_N.

Each of the basic cell blocks includes a unit cell block 11 having a plurality of unit cells, a first bit line sense amplifying unit 12 provided at one side of the unit cell block 11 for sensing and amplifying some data accessed to the unit cell block 11, and a second bit line sense amplifying unit 12_1 provided at the other side of the unit cell block 11 for sensing and amplifying the remaining data accessed to the unit cell block 11.

Also, the basic cell block includes control units 13, 13_1 for independently controlling a first connection between the first and second bit line sense amplifying units 12 and 12_1 and the first global bit line GBL_W and a second connection between the first and second bit line sense amplifying units 12 and 12_1 and the global bit line GBL_R according to an access mode. Each of the control units 13 and 13_1 includes a write controller for controlling the first connection between the first and second bit line sense amplifying units 12 and 12_1 and the first global bit line GBL_W during a write access and a read controller for controlling the second connection between the first and second bit line sense amplifying units 12 and 12_1 and the second global bit line GBL_R. The control units independently control the first connection and the second connection and simultaneously control the first connection and the second connection, so that they can simultaneously perform the write access and the read access so as to write and read data in and from the same unit cell block or different unit cell blocks. In the meantime, the global sense amplifying units includes a first global sense amplifying unit 14 for sensing and amplifying data for write access to the unit cell block and latching the sensed and amplified data and a second global sense amplifying unit 14_1 for latching the data sensed and amplified in the bit line sense amplifying units 12 and 12_1.

Figure 4:
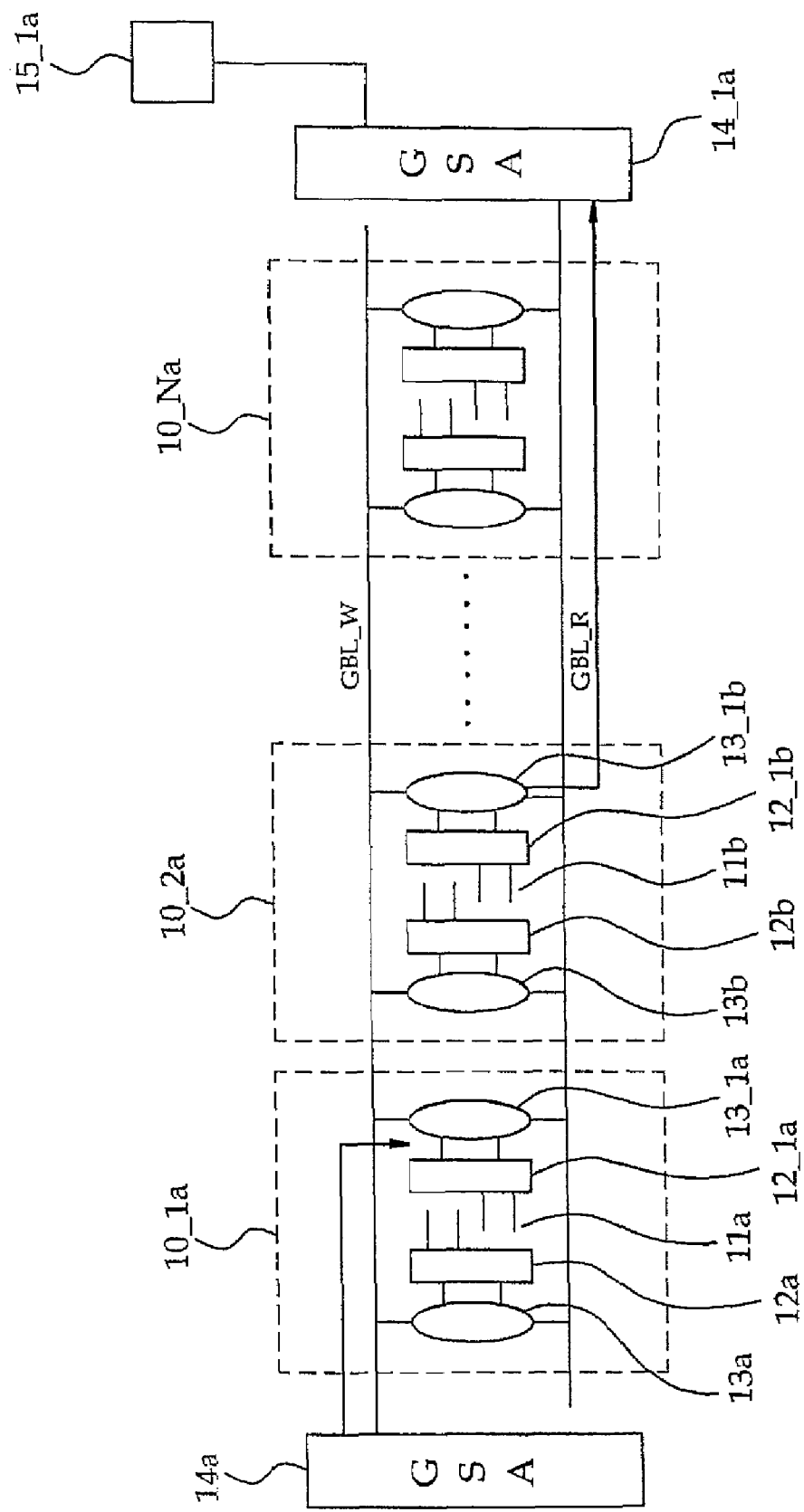
FIG. 4 is a detailed view showing a part of a basic cell block shown in FIG. 3.

FIG. 4 is a detailed view showing a part of a basic cell block of the semiconductor memory device shown in FIG. 3.

The operation of simultaneously performing a write access for writing data in a basic cell block 10_1a and a read access for reading data from another basic cell block 10_2a will be described in more detail hereinafter with reference to FIG. 4.

<Write Access Mode>

A data signal to be written is sensed and amplified by a first global sense amplifying unit 14a. The amplified data signal is inputted to a bit line sense amplifying unit 12_1a of a basic cell block 10_1a through a first global bit line GBL_W. a write controller of a control unit 13_1a controls the first global bit line GBL_W and the bit line sense amplifying unit 12_1a to be connected to each other so that the data signal transmitted from the first global sense amplifying unit 14a through the first global bit line GBL_W can be accessed to a unit cell block 11a.

<Read Access Mode>

When it is desired to perform the read access to read data stored in a unit cell block 11b, a bit line sense amplifying unit 12_1b is enabled in response to an enable signal of the bit line sense amplifying unit, and senses and amplifies a data signal applied to the bit line. A read controller of a control unit 13_1b controls a second global bit line GBL_R and the bit line sense amplifying unit 12_1b to be connected to each other so that the amplified data signal can be transmitted to a global sense amplifying unit 14_1a through the second global bit line GBL_R.

The amplified data signal transmitted to the global sense amplifying unit 14_1a through the second global bit line GBL_R is sensed and amplified by the global sense amplifying unit 14_1a. A dummy capacitor 15_1a having a reference voltage of ½ VDD is attached to the global sense amplifying unit 14_1a and compares the amplified data signal with the reference voltage to read a value of the amplified data signal.

In other words, when it is desired to perform the write access to write data in the unit cell block 11a, the write controller of the control unit controls the first global bit line GBL_W and the bit line sense amplifying unit 12_1a to be connected to each other so that the data to be written in the unit cell block 11a can be transmitted to the global sense amplifying unit 12_1a through the first global bit line GBL_W. On the other hand, when it is desired to perform the read access to read data from the unit cell block 11b, the read controller of the control unit controls the second global bit line GBL_R and the bit line sense amplifying unit 12_1b to be connected to each other so that the data to be read from the unit cell block 11b can be transmitted to the second global bit line GBL_R through the global sense amplifying unit 12_1b.

Figure 5:
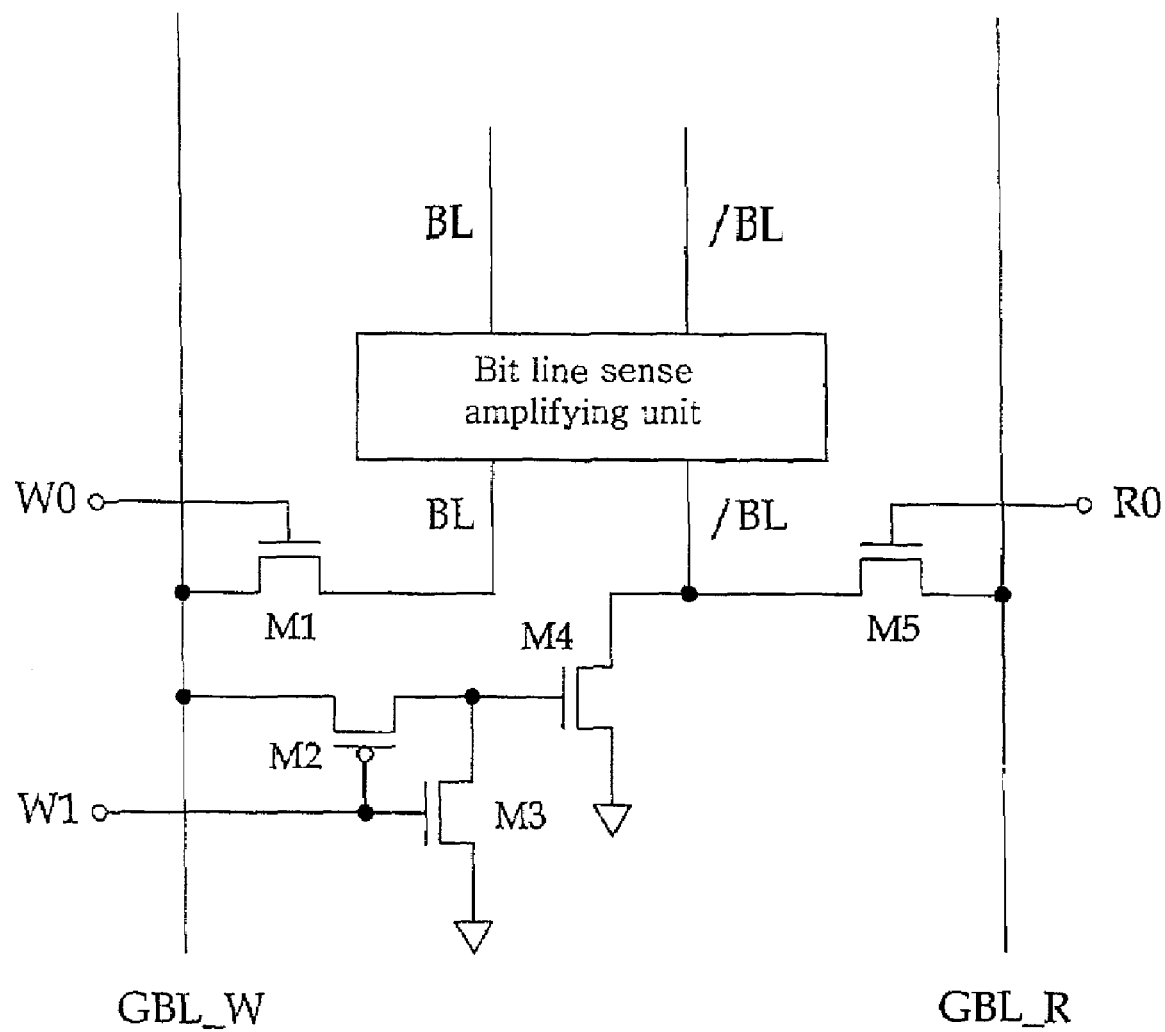
FIG. 5 is a circuit diagram showing a control unit according to an embodiment of present invention.

FIG. 5 is a circuit diagram showing a control unit according to an embodiment of present invention.

A control unit generates signals (write and write_b) for controlling the write access and a signal (read) for controlling the read access, and outputs the generated control signals to control terminals W0/W1 and R0. The control unit interconnects the first global bit line GBL_W and the bit line sense amplifying unit 12_1a in response to the generated control signals (write and write_b) so as to write data provided through the first global bit line GBL_W in the unit cell block 11a, or interconnects the second global bit line GBL_R and the bit line sense amplifying unit 12_1b in response to the generated control signal (read) so as to read data from the unit cell block 11b and output the read data through the second global bit line GBL_R.

More specifically, referring to FIG. 5, a terminal for outputting the control signal W1 is connected to a gate terminal of an MOS transistor M2 and a gate terminal of an MOS transistor M3. A source terminal of the MOS transistor M2 is connected to the first global bit line GBL_W, and a drain terminal of the MOS transistor M2 is connected to a source terminal of the MOS transistor M3 and a gate terminal of a MOS transistor M4. Also, a drain terminal of the MOS transistor M3 and a drain terminal of the MOS transistor M4 are grounded. A source terminal of the MOS transistor M4 is connected to a bit line sense amplifying unit for amplifying and outputting a data signal of a bit line /BL and a source terminal of an MOS transistor M5.

A terminal for outputting the control signal W0 is connected to a gate terminal of an MOS transistor M1. A source terminal of the MOS transistor M1 is connected to the first global bit line GBL_W, and a drain terminal of the MOS transistor M1 is connected to the bit line sense amplifying unit for amplifying and outputting a data signal of a bit line BL. Also, a terminal for outputting the control signal R0 is connected to a gate terminal of an MOS transistor M5. A drain terminal of the MOS transistor M5 is connected to the second global bit line GBL_R and the source terminal of the MOS transistor M5 is connected to the bit line sense amplifying unit for amplifying and outputting the data signal of the bit line /BL.

Now, the operation of a write access mode and a read access mode in the circuit diagram showing the control unit shown in FIG. 5 will be described hereinafter in more detail.

<Operation of Write Access Mode>

In the write access mode, the control signal W0 has a high level and the control signal W1 has a low level. The MOS transistors M1 and M2 are controlled to an ON state by the levels of the control signals W, W1 and R0, and the MOS transistors M3 and M5 are controlled to an OFF state. Thus, when a data signal having a high level is transmitted to the first global bit line GBL_W, the MOS transistor M4 is controlled to an ON state. Then, the data signal having a high level is inputted to the bit line BL of the bit line sense amplifying unit and the data signal having a low level is inputted to the bit line /BL of the bit line sense amplifying unit so as to allow data '1' to be written in the unit cell. In the meantime, when a data signal having a low level is transmitted to the first global bit line GBL_W, the MOS transistor M4 is controlled to an OFF state. Then, the data signal having a low level is inputted to the bit line BL of the bit line sense amplifying unit so as to allow data '0' to be written in the unit cell.

<Operation of Read Access Mode>

In the read access mode, the control signal W0 has a low level and the control signals W1 and RO has a high level. The MOS transistors M1, M2 and M4 are controlled to an OFF state by the levels of the control signals W, W1 and R0, and the MOS transistors M3 and M5 are controlled to an ON state. Thus, a data value is read from the unit cell and is outputted through the bit line /BL of the bit line sense amplifying unit so as to be transmitted to the second global bit line GBL_R. Then, the data transmitted through the second global bit line GBL_R is compared with the reference voltage of the dummy capacitor and then a data value is read.

The semiconductor memory device according to the present invention can access a plurality of data through the global sense amplifying unit and the global bit line, and enables the read controller and the write controller to independently control the global bit line and the bit line sense amplifying unit to be connected to each other to thereby perform the read access and the write access simultaneously.

While the present invention has been described with reference to the particular illustrative embodiments, it is not to be restricted by the embodiments but only by the appended claims. It is to be appreciated that those skilled in the art can change or modify the embodiments without departing from the scope and spirit of the present invention.

What is claimed is:

1. A semiconductor memory device including a unit cell block having a plurality of unit cells and a bit line sense amplifying unit for sensing and amplifying data accessed to the unit cell block, the semiconductor memory device comprising:
   a first global sense amplifying unit for sensing and amplifying a plurality of data for write access to the unit cell block and latching the sensed and amplified data;
   a second global sense amplifying unit for latching a plurality of data read-accessed in the unit cell block;

a first global bit line for transmitting data between the first global sense amplifying unit and the bit line sense amplifying unit;

a second global bit line for transmitting data between the second global sense amplifying unit and the bit line sense amplifying unit;

a control unit for independently controlling a first connection between the bit line sense amplifying unit and the first global bit line and a second connection between the bit line sense amplifying unit and the second global bit line according to an access mode.

2. The semiconductor memory device according to claim 1, wherein the control unit comprises:

a write controller for controlling the first connection between the bit line sense amplifying unit and the first global bit line during a write access; and a read controller for controlling the second connection between the bit line sense amplifying unit and the second global bit line.

3. The semiconductor memory device according to claim 2 wherein the write controller controls the bit line sense amplifying unit and the first global bit line to be connected to each other and the read controller controls the connection between the bit line sense amplifying unit and the second global bit line to be interrupted during the write access.

4. The semiconductor memory device according to claim 2 wherein the read controller controls the connection between the bit line sense amplifying unit and the first global bit line to be interrupted and controls the bit line sense amplifying unit and the second global bit line to be connected to each other during the read access.

5. The semiconductor memory device according to claim 3 wherein the write controller provides a data signal having a high level transmitted through the first global bit line and a data signal having a low level as a compensation signal of the high signal to the bit line sense amplifying unit so as to write the data signal having the high level in the unit cell block, and provides a data signal having a low level transmitted through the first global bit line to the bit line sense amplifying unit so as to write the data signal having the low level in the unit cell block.

* * * * *